(12) United States Patent
Chatterjee et al.

(10) Patent No.: US 8,114,744 B2
(45) Date of Patent: Feb. 14, 2012

(54) METHODS FOR REDUCING GATE DIELECTRIC THINNING ON TRENCH ISOLATION EDGES AND INTEGRATED CIRCUITS THEREFROM

(75) Inventors: Amitava Chatterjee, Plano, TX (US); Seetharaman Sridhar, Richardson, TX (US); Xiaoju Wu, Irving, TX (US); Vladimir F. Drobny, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 172 days.

(21) Appl. No.: 12/345,142

(22) Filed: Dec. 29, 2008

(65) Prior Publication Data
US 2010/0164004 A1    Jul. 1, 2010

(51) Int. Cl.
*H01L 21/336* (2006.01)
(52) U.S. Cl. .. 438/275; 438/296; 438/770; 257/E21.546
(58) Field of Classification Search .................. 438/275, 438/296, 424, 770; 257/E21.546
See application file for complete search history.

(56) References Cited

U.S. PATENT DOCUMENTS
6,413,828 B1   7/2002 Lam

*Primary Examiner* — Minh-Loan T Tran
(74) *Attorney, Agent, or Firm* — Warren L. Franz; Wade J. Brady, III; Frederick J. Telecky, Jr.

(57) ABSTRACT

A method of fabricating an integrated circuit (IC) including a plurality of MOS transistors and ICs therefrom include providing a substrate having a silicon including surface, and forming a plurality of dielectric filled trench isolation regions in the substrate, wherein the silicon including surface forms trench isolation active area edges along its periphery with the trench isolation regions. A first silicon including layer is deposited, wherein the first silicon including extends from a surface of the trench isolation regions over the trench isolation active area edges to the silicon including surface. The first silicon including layer is completely oxidized to convert the first silicon layer to a silicon oxide layer, wherein the silicon oxide layer provides at least a portion of a gate dielectric for at least one of the plurality of MOS transistors. A patterned gate electrode layer is formed over the gate dielectric, wherein the patterned gate electrode layer extends over at least one of the trench isolation active area edges to the silicon including surface, and fabrication is then completed.

17 Claims, 5 Drawing Sheets

METHODS FOR REDUCING GATE DIELECTRIC THINNING ON TRENCH ISOLATION EDGES AND INTEGRATED CIRCUITS THEREFROM

FIELD OF THE INVENTION

Embodiments of the present invention relate to methods of manufacturing integrated circuits (ICs) and in particular to methods of manufacturing Metal Oxide Semiconductor (MOS) field effect transistors (FETs) having trench isolation, and ICs therefrom that reduce thermally grown gate dielectric thinning at the trench/active area interfaces.

BACKGROUND

One common isolation technique for electrically isolating transistors is based on trench isolation. The trench isolation process is generally more suitable for semiconductor chips having high packing density, as compared to local oxidation (LOCOS) processing. A trench region is formed in conventional semiconductor substrates (e.g. Si) with a depth deep enough for isolating the devices or different wells. In general, trenches are etched using a patterned hard mask material (e.g. silicon nitride) over a pad oxide for masking the active area. A thin liner oxide is generally thermally grown and the trenches are then refilled with a deposited dielectric material, such as oxide deposited using a high-density plasma chemical vapor deposition (HDP-CVD) process.

As used herein, the term "trench isolation" applies for both conventional (e.g. bulk Si) substrates as well as silicon on insulator (SOI) substrates. Applied to conventional substrates, as used herein trench isolation includes deep trench isolation which is typically 1-5 $\mu$m deep, and shallow trench isolation which is typically <1 $\mu$m deep, such as 0.3 to 0.7 $\mu$m deep. Applied to SOI substrates, as used herein, trench isolation includes the isolation regions between the active area islands. In the case of thin-film SOI, the trench isolation regions like in the conventional substrate case are generally filled with a deposited dielectric, but are typically shallower than their conventional substrate counterparts, being generally <0.5 $\mu$m deep, such as 0.01 to 0.3 $\mu$m deep.

Typically, after the trench isolation process is completed, the pad oxide (if present) is removed and a gate oxide is thermally grown. Sometimes a sacrificial (dummy) gate oxide is grown and stripped prior to the final gate oxide growth.

As known in the art, thermally grown gate oxide thinning occurs at the trench isolation/active area edges (or corners) when the gate oxide thickness is at least several hundred Angstroms. Such thinning results from the reduced diffusion controlled (parabolic) oxidation rate at the mechanically stressed relatively sharp trench isolation edge relative to gate oxide grown in the active area away from the trench isolation edge. Although steam oxidation, higher temperature, and high pressure oxidation can prevent or at least reduce thinning at the trench isolation edge if target thickness is relatively small by extending the linear oxidation regime, such as up to about 25 to 200 Angstroms, thicker gate oxides needed for higher voltage transistors, such as from 300 to 5,000 Angstroms (e.g. for high voltage transistors 1,000 to 5,000 Angstroms for max Vg of 36 V to 200 V), result in significant thinning at the trench isolation edge which can result in yield loss or reliability problems associated with gate oxide failure. Typically, the gate oxide thickness for thicker gate oxides at the trench isolation edge is $\leq$75% of the gate oxide thickness over the active area away from the trench isolation edge.

Accordingly, it is desirable to provide methods for fabricating an IC in which a relatively thick gate oxide, such as 300 to 5,000 Angstroms, can be grown with reduced or eliminated gate oxide thinning relative to the gate oxide thickness grown on the active area away from the trench isolation edge.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe methods for fabricating integrated circuits (IC) including a plurality of trench isolated Metal Oxide Semiconductor (MOS) transistors ICs having reduced gate dielectric thinning and corner sharpening at the trench isolation/semiconductor edges, for gate oxide thickness generally $\geq$300 Angstroms. Embodiments of the invention substantially overcome the yield and reliability impacting problem of gate oxide thinning at trench-active edge due to reduced oxidation rate of the edge relative to that of the active area away from the edge.

In one embodiment of the invention, a method of fabricating an IC including a plurality of MOS transistors comprises providing a substrate having a silicon comprising surface. A plurality of dielectric filled trench isolation regions are formed in the substrate, wherein the silicon comprising surface forms trench isolation active area edges along their periphery with the trench isolation regions. A first polysilicon or amorphous silicon comprising layer is then deposited, wherein the first polysilicon or amorphous silicon comprising layer extends from a surface of the trench isolation regions over the trench edges to the silicon comprising surface. The first silicon comprising layer is then completely oxidized to convert the first silicon comprising layer to a silicon oxide layer, wherein the silicon oxide layer provides at least a portion of a gate dielectric for at least one of the plurality of MOS transistors. A patterned gate electrode layer is formed over the gate dielectric, wherein the patterned gate electrode layer extends from the surface of the trench isolation regions over the trench edges to the silicon comprising surface. Fabrication of the IC is then completed generally according to standard semiconductor manufacturing procedures. Embodiments of the invention can include divot reduction processing, such as hard mask pullback processing.

DETAILED DESCRIPTION

Figure 1A:
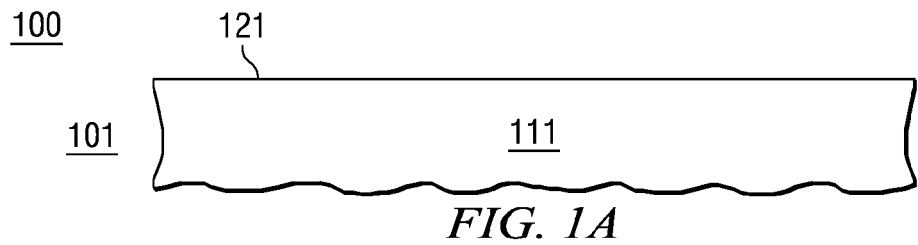
FIG. 1A-E show successive intermediate cross sectional depictions for a first exemplary method of fabricating an integrated circuit (IC) including a plurality of Metal Oxide Semiconductor (MOS) transistors that have reduced gate dielectric thinning at the trench edges, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In a first embodiment of the invention, oxidation of deposited polysilicon or amorphous silicon is used to reduce or eliminate thick gate oxide thinning and corner sharpening at trench isolation active area edges. This embodiment avoids the need to grow a thick gate oxide from the active Si comprising area at the trench edge as done in conventional processes by using a new process flow where at least a portion, and in one embodiment the entire thickness, of the thick gate oxide (e.g. for high voltage devices) is provided by oxidizing a deposited layer of polysilicon or amorphous silicon.

Figure 1B:
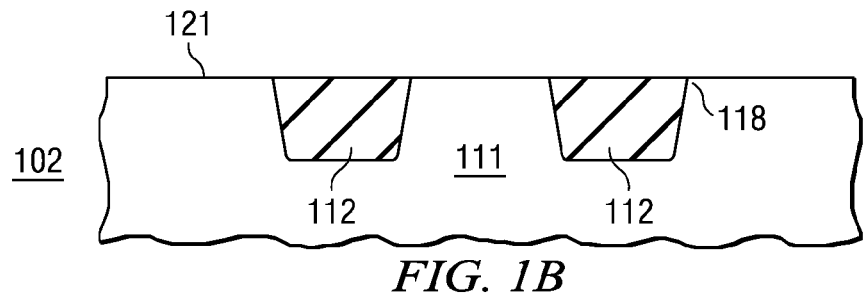

FIG. 1A-E show successive intermediate cross sectional depictions for an exemplary method 100 of fabricating an IC including a plurality of MOS transistors that have reduced gate dielectric thinning and corner sharpening at the trench isolation active area edges, according to an embodiment of the invention. FIG. 1A shows a cross sectional depiction after step 101 which comprises providing a substrate 111 having a single crystal silicon comprising surface 121, such as a Si or Si/Ge surface. The substrate 111 can comprise a conventional single crystal substrate or an SOI substrate. FIG. 1B shows a cross sectional depiction after step 102 which comprises forming a plurality of dielectric filled trench isolation regions 112 in the substrate 111 using well known processing, wherein the trench isolation forms trench isolation active area edges 118 along its periphery with the silicon comprising surface 121. Although not shown, trench regions 112 can include a liner layer to line the trench isolation regions 112, such as a liner oxide.

Figure 1C:
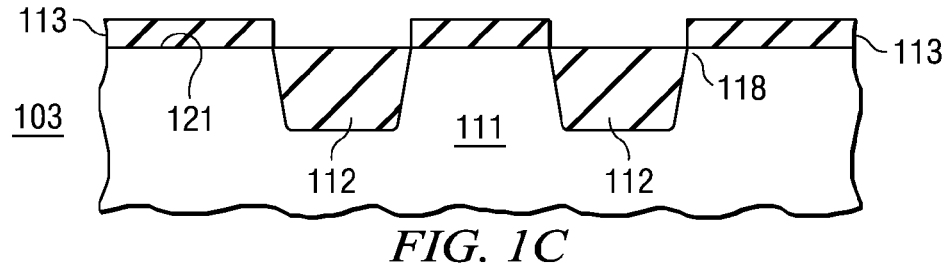

In step 103, a pad dielectric 113, such as a pad oxide, may be grown and/or deposited as shown in FIG. 1C's cross sectional depiction. In the case of a thermal oxide, the oxide is grown up to a thickness limited by the oxidation process remaining in the linear regime, which can range from 25 Angstroms to several hundred Angstroms at standard pressure depending on oxidation conditions, and higher thickness values under high pressure conditions. Parameters for the step 103 oxidation can be temperature, time, oxidation ambient, and pressure. This oxidation step is optional, and in one embodiment of the invention, step 103 is skipped entirely.

As known in the art, thermally grown silicon oxide comprising layers are distinguishable as compared to deposited silicon oxide comprising layers. In addition, since deposited dielectrics are generally deposited at significantly lower temperatures as compared to thermal oxides, deposited dielectrics general exhibit structural inferiority resulting in higher leakage currents and lower breakdown strengths, even if later densified at high temperature. Another way to distinguish thermal and deposited silicon oxide layers is by reference to stoichiometry. Thermal oxides are essentially stoichiometric, such as almost exactly $SiO_2$, whereas deposited oxides tend to be silicon rich, and thus represented by $SiO_{2-x}$, where x is generally 0.02 to 0.70.

Exemplary data evidencing formation of silicon rich deposited silicon oxides presented as Si-excess (in atomic %) as a function of the precursor gas flow ratio (R) for the precursors nitrous oxide to silane is shown in the Table below. This data was obtained from M. Riera et al. "Modeling of non-stoichiometric silicon oxides obtained by plasma enhanced chemical vapour deposition process" Thin Solid Films 515 (2007) 3380-3386. Silicon excess in atomic percentage and the refractive index of silicon oxide samples deposited at different flow ratios (R) are shown in the Table below. A 50% Si-excess above stoichiometric $SiO_2$ translates to a silicon oxide material characterized as $SiO_{2-x}$ where x=0.67.

| Flow ratio (R) | Si-excess (atomic %) | Refraction index |
|---|---|---|
| 2.20 | 50.0 | 2.253 |
| 3.60 | 37.0 | 1.939 |
| 5.50 | 25 | |

Moreover, thermally grown oxides derived from polysilicon or amorphous silicon comprising layers according to embodiments of the invention can be distinguished from thermally grown oxides derived from single crystal Si comprising layers, based on surface roughness. For example, a high-resolution transmission electron microscope (TEM) image can be used to evidence such differences.

As known in the art, a deposited amorphous silicon layer will change to a polycrystalline layer in the oxidation furnace prior to being oxidized due to the high-temperature of the oxidation process (e.g. >800° C.). The grain size distribution of the polysilicon layer for either the deposited amorphous or polysilicon case depends on the thermal processes received, but is typically primarily in the tens of nanometers range. Since the crystal orientation at different locations in the polysilicon layer is different, the resulting oxide thickness will vary from regions derived from one grain to adjacent regions derived from another grain. The oxidation of the grains of varying crystal orientation in the polysilicon generally results in local area variations (i.e. over dimensions of the size of individual grains) of thermally grown oxide thickness of at least 10 angstroms for oxide thickness at least several hundred angstroms thick within localized regions, resulting in significant surface roughness. For example, polycrystalline silicon grains are generally columnar in shape. Thus, there are likely to be several instances of oxide thickness changing by greater than 100 angstroms, and the top surface of the oxide will not faithfully follow the contour of the bottom surface. In a typical embodiment, the local area variation may generally be between 20 and 100 Angstroms.

In contrast, thermally grown oxides derived from single crystal Si comprising layers, including epitaxial layers, do not have surface roughness resulting from varying grain orientations that as described above is characteristic of thermally grown oxides derived from polysilicon. Thermally grown oxides derived from single crystal Si comprising layers, will generally provide a surface that faithfully reproduces the contour of the underlying silicon surface to within about 2 to 3 angstroms.

Figure 1D:
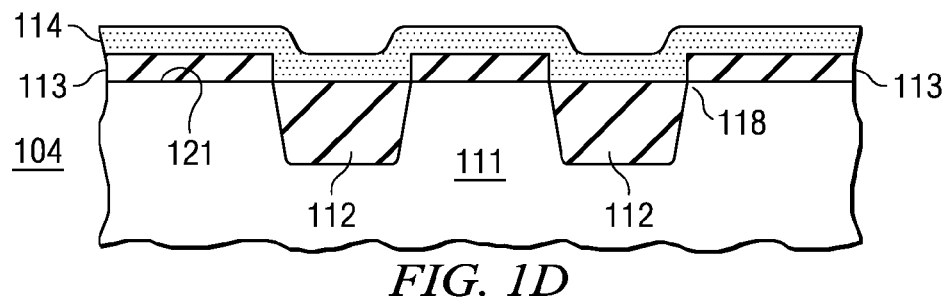

FIG. 1D shows a cross sectional depiction after step 104 in which a thin film of polycrystalline or amorphous silicon 114 is then deposited, where the thickness of the polycrystalline or amorphous silicon 114 is selected so that upon subsequent oxidation it completely oxidizes, and together with the optional pad oxide 113 from step 103 has a combined thickness that is $\leqq$ the target final thick gate dielectric thickness. The target final thick gate dielectric thickness is generally from 300 to 5,000 Angstroms, such as 450 to 3,000 Angstroms. target final thick gate dielectric thickness.

Figure 1E:
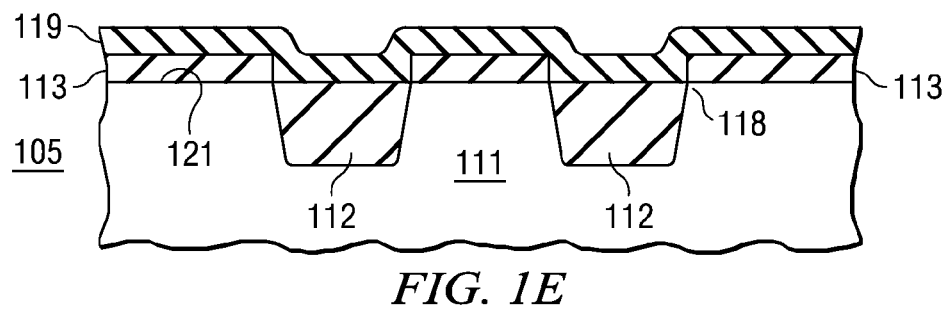

FIG. 1E shows a cross sectional depiction after step 105 which comprises an oxidation which is generally performed to completely oxidize the polycrystalline or amorphous silicon layer 114 to the final target oxide thickness (oxide layer 119+oxide layer 113 (if present)). Optionally, additional oxidation time beyond the time needed to completely oxidize the polycrystalline or amorphous silicon 114 can be used to oxidize some of the silicon comprising surface 121 below the oxidized polycrystalline or amorphous silicon 114. However, additional oxidation time should generally be limited due to the corner sharpening that may occur as a result. Fabrication of the IC is then completed generally according to standard manufacturing procedures. In one embodiment of the invention, method 100 is combined with a divot reduction technique, such as the known hard mask (e.g. nitride) pullback processing to reduce the extent of divots, as well as a liner oxide to line the surface of the trench regions 112.

FIG. 2A-H show successive intermediate cross sectional depictions for an exemplary method 200 of fabricating an IC including a plurality of MOS transistors in which trench isolation oxide loss and divoting in the trench isolation comprising structures is significantly reduced, and ICs formed therefrom. This related embodiment of the invention addresses the problem of trench significant isolation oxide loss and divoting of the trench oxide at the trench isolation active area edges that occurs when a thick gate oxide (e.g. >300 Angstroms) is etched away to open active regions designated for thinner gate oxides in a multiple gate oxide or dielectric flow, such as a dual or triple gate oxide flow.

Figure 2A:
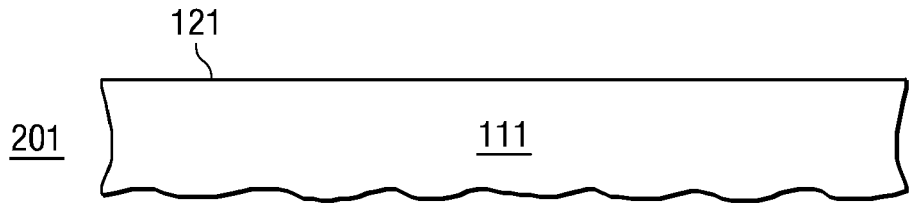
FIG. 2A-H show successive intermediate cross sectional depictions for a second exemplary method of fabricating an IC including a plurality of MOS transistors that have reduced gate dielectric thinning at the trench edges, according to an embodiment of the invention.
Figure 2B:
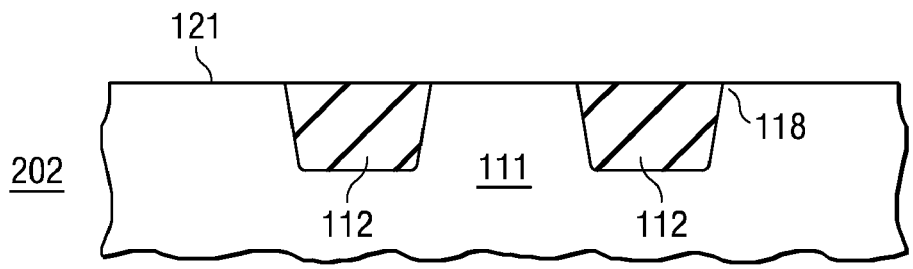
Figure 2C:
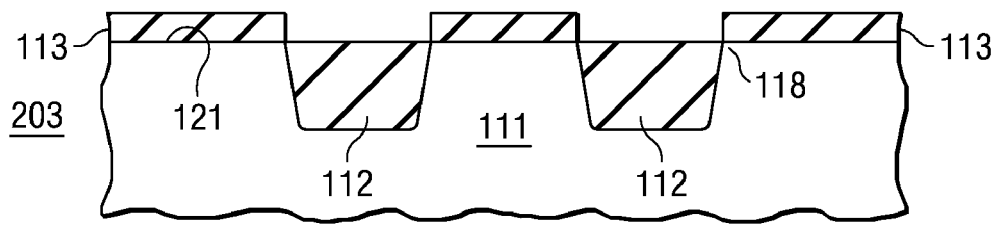
Figure 2D:
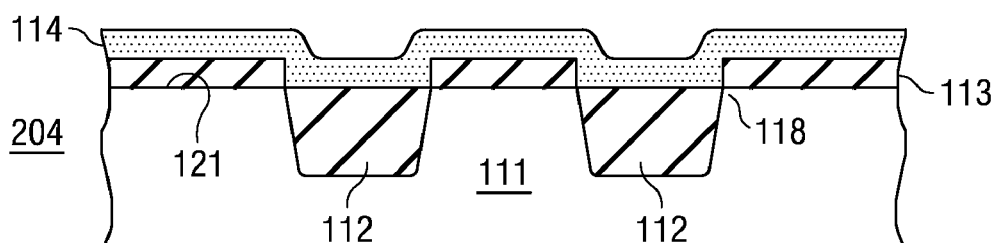
Figure 2E:
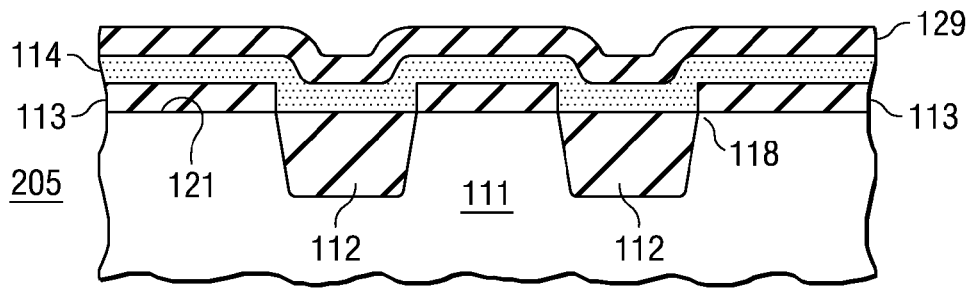
Figure 2F:
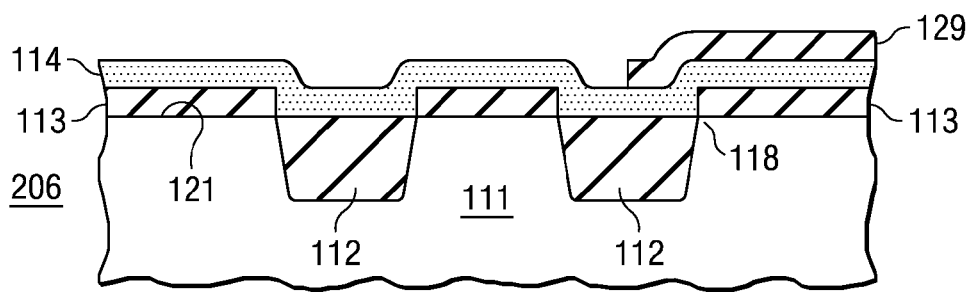
Figure 2G:
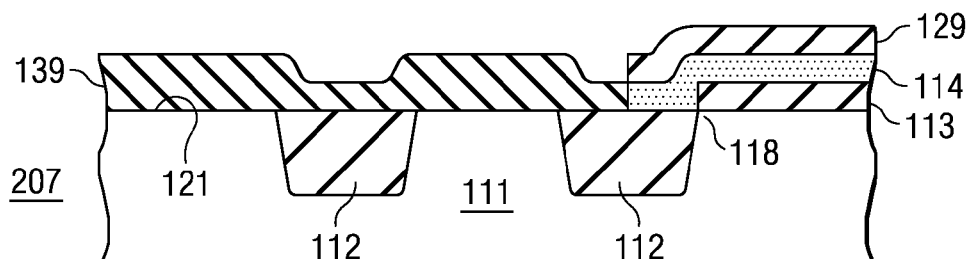
Figure 2H:
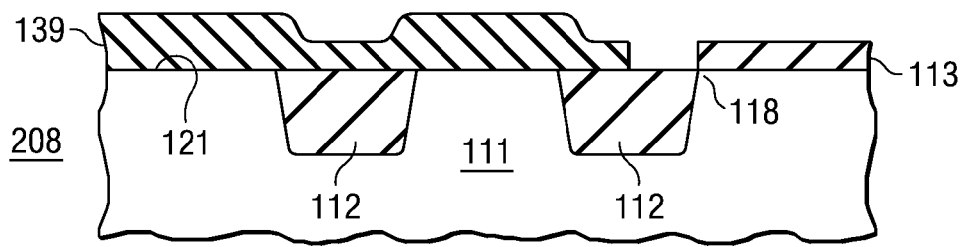

Method 200 includes steps 201-204 shown in FIG. 2A-2D, which generally follow steps 101-104, respectively. FIG. 2E shows a cross sectional depiction after step 205 which comprises depositing a hard mask material 129, such as silicon nitride, silicon carbide, or silicon oxynitride, on the polysilicon or amorphous silicon layer 114. FIG. 2F shows a cross sectional depiction after step 206 which comprises patterning and etching the hard mask layer to expose the polysilicon or amorphous silicon layer 114 in areas needing a thick gate oxide, including over the trench isolation active area edge. FIG. 2G shows a cross sectional depiction after step 207 which comprises completely oxidizing the exposed polysilicon or amorphous silicon layer 114 to form thick gate oxide layer 139, wherein the hard mask layer 129 remaining on the wafer protects the rest of the wafer/die area from oxidation. Oxidation of the surface of hard mask layer 129 that generally occurs if hard mask layer 129 comprises silicon nitride is not shown. FIG. 2H shows a cross sectional depiction after step 208 which comprises removing the hard mask material 129 along with any unreacted polysilicon or amorphous silicon 114 (if present). Fabrication of the IC is then completed generally according to standard manufacturing procedures.

Advantages of method 200 include only one added mask level for adding the thick gate oxide used for a thick oxide comprising device. In addition, the thick gate oxide layer 139 generally has the same thickness at the trench isolation active area edges as over the bulk of the associated silicon comprising surface 121 having thick gate oxide layer 139. Moreover, divoting is reduced or essentially eliminated by method 200 since the hard mask material 129 protects the surface of the rest of the silicon comprising surface 121 from oxidizing and so there is no need to strip the thick gate oxide layer 139 from other parts of the wafer which can result in divoting.

Figure 3A:
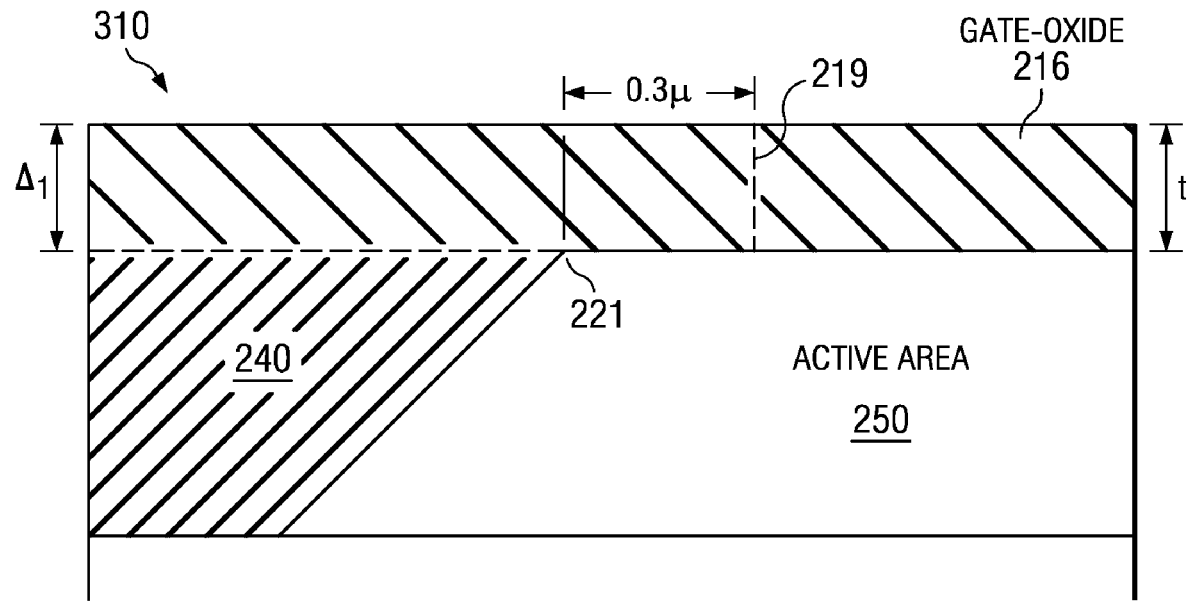
FIG. 3A is a cross section depiction of the resulting layer topography around a trench edge and a distinguishable topographical characteristics for devices according to embodiments of the invention, as compared to the resulting topography obtained from a conventional process flow shown in FIG. 3B.
Figure 3B:
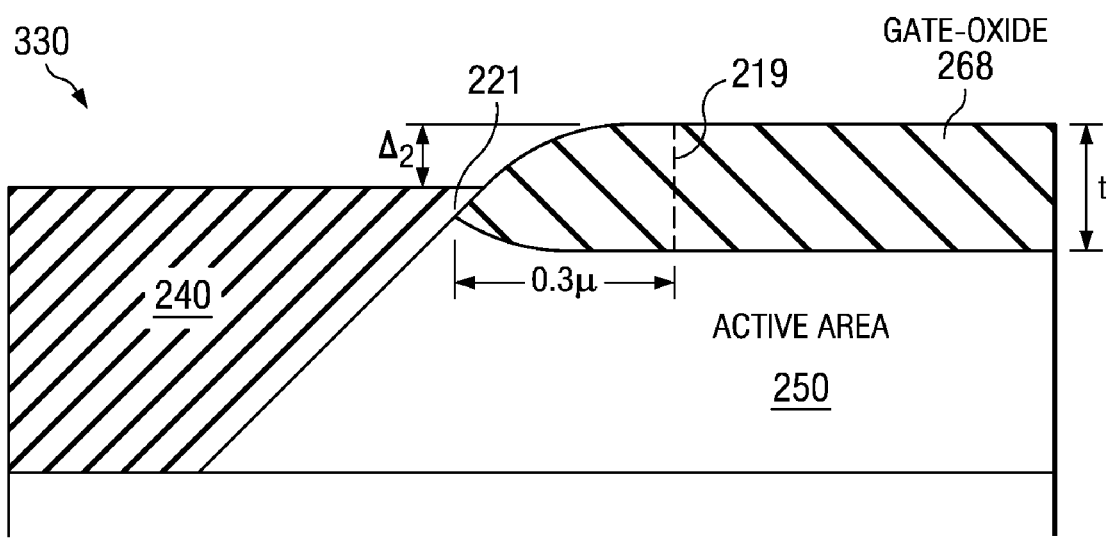

FIG. 3A is a cross section depiction of the resulting layer topography and a distinguishable topographical characteristics for devices according to embodiments of the invention for either method 100 or method 200, as compared to the resulting topography from a conventional trench isolation comprising process flow having thick oxide devices shown in FIG. 3B labeled as "prior art". Divots which may be present to some generally minor extent, are not shown.

Cross section 310 shown in FIG. 3A is a cross sectional depiction based on the cross section shown in FIG. 1E and FIG. 2H, wherein the trench isolation region is indicated as 240. The thick oxide layer is shown in FIG. 3A as gate oxide layer 216 having a thickness "t". "t" is generally 300 to 5,000 Angstroms thick, but can be above or below this range. $\Delta_1$ indicates the height difference between the upper surface of the gate oxide 216 at the highest point over the trench isolation 240 (the height being essentially a constant thickness over trench isolation 240) and the top surface of trench isolation 240 (generally a deposited dielectric, such as a deposited oxide) which is essentially coplanar with the lower surface of the gate oxide 216. $\Delta_1 > 0$ and is generally approximately equal to 1.5 times the thickness of the polysilicon or amorphous silicon deposited and converted to thermal oxide in the case the pad oxide step 103 or equivalent is skipped. It can also be seen that the thickness of the oxidized polysilicon or amorphous silicon over the gate oxide 216 over the trench isolation active area edge 221 is $\geqq 95\%$ of a thickness of gate dielectric layer over the surface of active area 250 away from the edge, such as at a reference position 219 that is 0.3 µm away from the trench isolation active area edge 221.

Cross section 330 shown in FIG. 3B is shown as prior art is a depiction following thermal gate oxidation showing resulting topography resulting from a conventional process flow. As with cross sections 310 shown in FIG. 3A, the thickness of the gate oxide, shown as gate oxide 268, is "t". There is no gate oxide 268 over the surface of the trench isolation region 240. $\Delta_2$ indicates the height difference between the upper oxide surface at the highest point over the trench isolation 240 and top surface of trench isolation 240 (generally a deposited dielectric, such as a deposited oxide), which is shown as $\approx 0$. It can also be seen that the thickness of the gate oxide 268 over the trench isolation active area edge 221 is about <60% of a thickness of gate dielectric layer 268 over the surface of active area 250 away from the edge, such as at a reference position 219 that is 0.3 µm away from the trench isolation active area edge.

Figure 4:
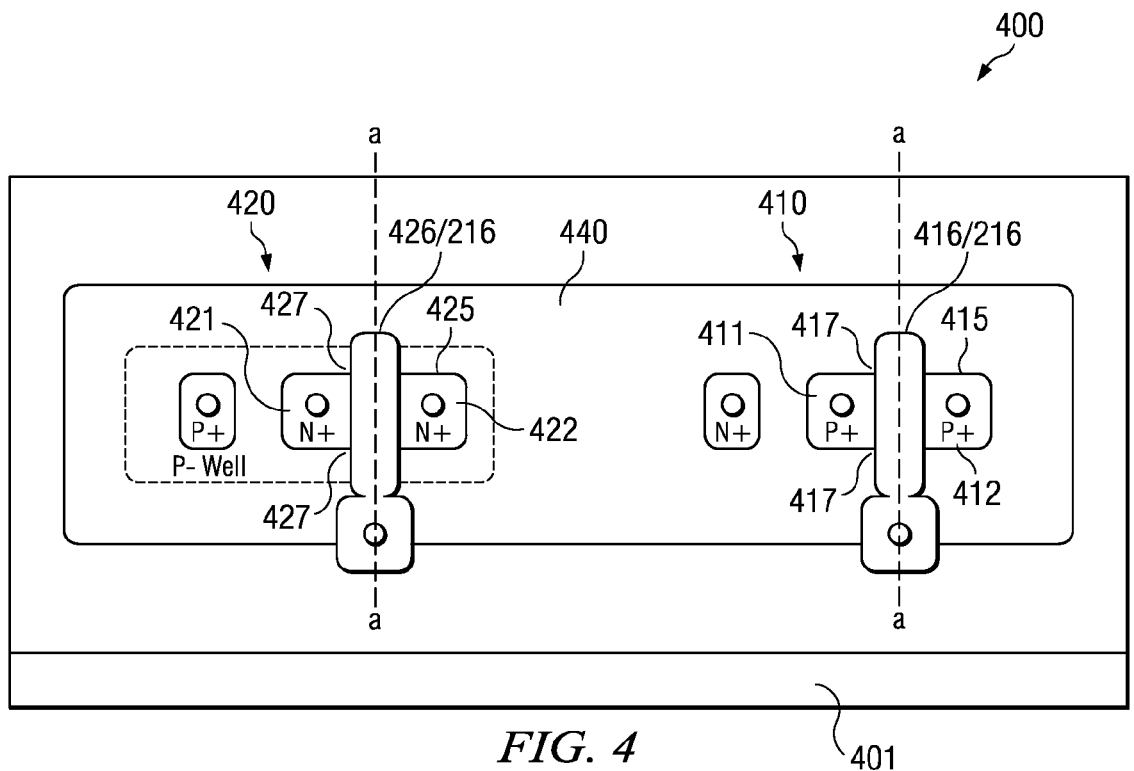
FIG. 4 shows a top view depiction of an IC comprising a PMOS and NMOS device, each having an essentially constant gate oxide thickness and thus no measurable gate dielectric thinning at the trench/active area edge, an embodiment of the invention.

FIG. 4 shows a top view depiction of an IC 400 comprising a PMOS device 410 and an NMOS device 420, each having an essentially constant gate oxide thickness and thus no measurable (<5%, such as 0%) gate dielectric thinning at the trench isolation active area edges, according to an embodiment of the invention. IC 400 comprises a substrate 401 having a silicon comprising surface. IC 400 includes a plurality of dielectric filled trench isolation regions 440 formed in the substrate. The silicon comprising surface forms trench isolation active area edges along its periphery with the active areas, such as active area 415 for the gate electrode and S/D regions for PMOS device 410 and active area 425 for NMOS device 420. A patterned gate stack comprising a patterned gate electrode 416 for PMOS 410 and gate electrode 426 for NMOS device 420, on a gate dielectric layer (shown as gate oxide 119/113 in FIG. 1C-E or gate oxide 139 in FIGS. 2G and H) comprising primarily (and generally entirely) thermally grown silicon oxide comprising formed on the silicon comprising surface of substrate 401. The patterned gate electrodes 416 and 426 extend over the trench isolation active area edges shown as edge 417 for PMOS 410 and 427 for NMOS 420.

PMOS 410 includes source region 411 and drain region 412 on opposite sides of the gate stack 416/139, while NMOS 420 includes source region 421 and drain region 422 on opposite sides of the gate stack 426/139. A thickness of the thermally grown silicon oxide comprising gate dielectric layer 216 over the trench isolation active area edges 417 and 427 is at least 95% of a thickness of gate dielectric layer 139 over the silicon comprising surface 0.3 μm away from the trench isolation active area edges 417/427 as described above relative to FIG. 3A, which corresponds to the cut shown along the line a-a shown in FIG. 4.

Figure 5:
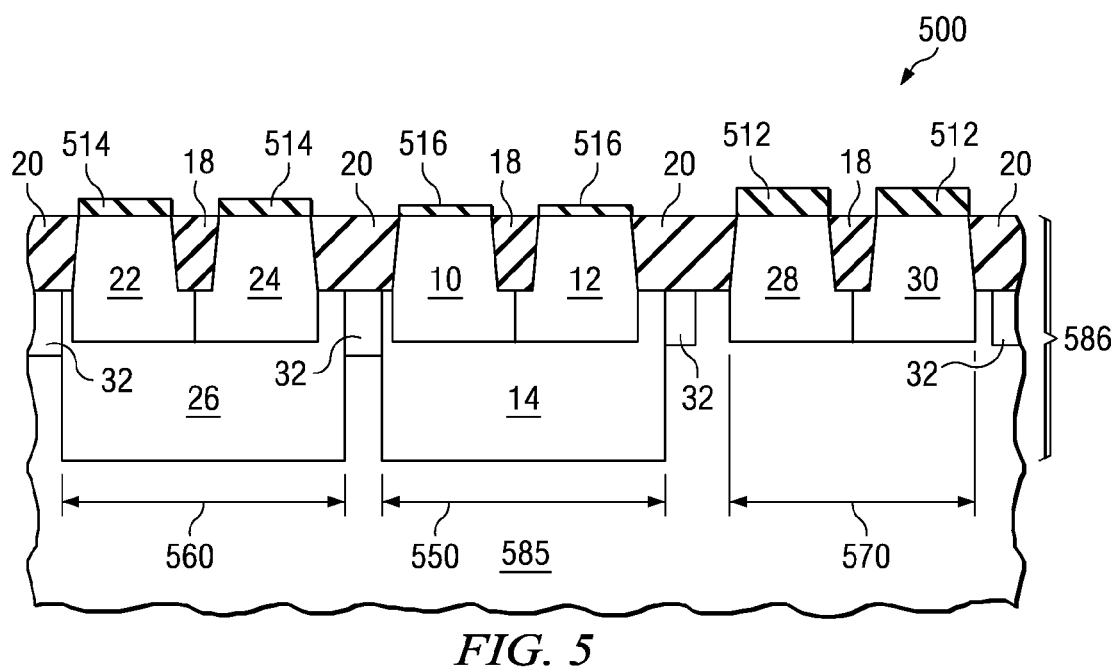
FIG. 5 is a simplified cross sectional view of a triple gate dielectric (TGD) device according to an embodiment of the invention.

FIG. 5 is a simplified cross sectional view of a triple gate dielectric (TGD) device 500 according to an embodiment of the invention. TGD device 500 includes a substrate 585 having semiconductor regions of the first kind 550, semiconductor regions of the second kind 560, and semiconductor regions of the third kind 570 formed therein. Semiconductor regions of the first kind 550 are generally low voltage regions over which devices with thin gate dielectrics (e.g. and 15 to 100 Angstroms) are formed, semiconductor regions of the second kind 560 are intermediate voltage regions over which devices with gate dielectrics of intermediate thickness (e.g. 50 to 250 Angstroms) 514 are formed and semiconductor regions of the third kind are high voltage regions over which devices with thick gate dielectrics (e.g. 300 to 5,000 Angstroms).

Correspondingly, there is a low threshold voltage for MOSFET in semiconductor regions of the first kind, an intermediate threshold voltage for MOSFET in semiconductor regions of the second kind and a high threshold voltage for MOSFET in semiconductor regions of the third kind. Gate electrodes are not shown.

In the semiconductor regions of the first kind 550 there is an n-well 10 and a p-well 12, which are formed in a deep n-well 14 that is formed in a p-surface region 586 of substrate 585. An isolation region, 18, which is generally a trench isolation region electrically isolates the n-well 10 from the p-well 12. FIG. 5 depicts examples of what could constitute semiconductor regions of the first kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

Semiconductor regions of the second kind 560 includes an n-well 22 and a p-well 24, which are formed in a deep n-well 26 that is formed in a p-substrate 505. An isolation region, 18, which is generally a trench isolation region, separates the n-well 22 from the p-well 24. FIG. 5 depicts examples of what could constitute semiconductor regions of the second kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

In the same way, semiconductor regions of the third kind 570 includes an n-well 28 and a p-well 30, which are formed in a p-substrate 505. An isolation region, 18, which is generally a trench isolation region, separates the n-well 28 from the p-well 30. FIG. 5 depicts examples of what could constitute semiconductor regions of the third kind, which could contain any number of n-type or p-type semiconductor regions. The semiconductor regions can be any kind of semiconductor region and not necessarily wells and they could be formed in an n-substrate.

Isolation regions 20 are shown in FIG. 5 separating regions of different kinds 550, 560 and 570. These isolation regions can be trench isolation regions that are disposed over field implant regions 32, which can be added as known in the art to enhance the isolation.

Embodiments of the invention can be integrated into a variety of process flows to form a variety of ICs and related products. Exemplary devices and products include ICs including high voltage devices that provide gate to body breakdown voltages >25 volts that generally require gate dielectrics having a minimum thickness between 300 and 1,400 Angstroms, as well as double and triple gate comprising ICs that include such high voltage devices. For example, the high voltage devices can be embodied as conventional CMOS devices, DEMOS or LDMOS. Exemplary devices include power management devices, display drivers and medical applications (e.g. defibrillators).

The semiconductor substrates may include various elements therein and/or layers thereon. Regarding substrates, the substrates can be conventional substrates or SOI substrates. These elements can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating an integrated circuit including a plurality of MOS transistors, comprising:
    providing a substrate having a silicon comprising surface;
    forming a plurality of dielectric filled trench isolation regions in said substrate, wherein said silicon comprising surface forms trench isolation active area edges along its periphery with said trench isolation regions;
    depositing a first silicon comprising layer, said first silicon comprising layer extending from a surface of said trench isolation regions over said trench isolation active area edges to said silicon comprising surface;
    oxidizing said first silicon comprising layer to completely convert said first silicon comprising layer to a silicon oxide layer, wherein said silicon oxide layer provides at least a portion of a gate dielectric for at least one of said plurality of MOS transistors; and
    forming a patterned gate electrode layer over said gate dielectric, wherein said patterned gate electrode layer extends over at least one of said trench isolation active area edges to said silicon comprising surface.

2. The method of claim 1, further comprising forming a 50 to 200 Angstrom thick silicon oxide layer on said silicon comprising surface before said depositing of said first silicon comprising layer.

3. The method of claim 1, wherein said first silicon comprising layer is deposited directly on said silicon comprising surface.

4. The method of claim 1, wherein said depositing step comprises polysilicon or amorphous silicon deposition.

5. The method of claim 1, wherein a time for said oxidizing is sufficient to oxidize all said first silicon comprising layer and to oxidize a portion of said silicon comprising surface under said first silicon comprising layer.

6. The method of claim 1, wherein said forming said plurality of dielectric filled trench isolation regions comprises a hard mask pullback process before said forming said plurality of dielectric filled regions.

7. The method of claim 1, wherein:
    said plurality of MOS transistors comprises a first plurality of MOS transistors in first regions of said substrate, said gate dielectric for said first plurality of MOS transistors having a first gate dielectric thickness, and at least a second plurality of MOS transistors in second regions of said substrate, said gate dielectric for said second plurality of MOS transistors having a second gate dielectric thickness, wherein said first gate dielectric thickness is at least 10%>said second gate dielectric thickness; and
    said method further comprises:
        before said depositing said first silicon comprising layer, forming a pad oxide on said silicon comprising surface; and
        following said depositing said first silicon comprising layer:
            depositing a hard mask layer over said first silicon comprising layer;
            patterning said hard mask layer to expose areas of said first regions of said silicon comprising surface, wherein said oxidizing step comprises a selective oxidization oxidizing only in said exposed areas of said first regions; and
        following said selective oxidizing step, removing said patterned hard mask layer and said first silicon comprising layer down to said pad oxide.

8. The method of claim 7, wherein said pad oxide comprises said gate dielectric for said second plurality of MOS transistors.

9. The method of claim 7, wherein said first and said second gate dielectric thicknesses are 300 to 5,000 Angstroms and 50 to 250 Angstroms, respectively.

10. The method of claim 7, wherein said hard mask layer comprises at least one of silicon nitride (SiN), silicon oxynitride (SiON) or silicon carbide (SiC).

11. The method of claim 7, wherein said plurality of MOS transistors further comprises a third plurality of MOS transistors in third regions of said substrate, wherein said second thickness<third thickness<said first thickness.

12. The method of claim 11, wherein said first, second and third gate dielectric thicknesses are 300 to 5,000 Angstroms, 50 to 250 Angstroms and 15 to 100 Angstroms, respectively.

13. A method of fabricating an integrated circuit, comprising:
    providing a substrate having a single crystal silicon surface;
    forming a plurality of dielectric filled trench isolation regions in the substrate, the trench isolation regions defining trench isolation active area edges along their peripheries at interfaces with the silicon surface;
    depositing a layer of polycrystalline or amorphous silicon over the silicon surface, over the trench isolation regions, and over the trench isolation active area edges;
    forming a hard mask layer over the layer of polycrystalline or amorphous silicon;
    patterning the hard mask layer to expose portions of the layer of polycrystalline or amorphous silicon;
    performing an oxidization selectively through the exposed portions of the hard mask layer, to completely convert the layer of polycrystalline or amorphous silicon to a silicon oxide layer, the silicon oxide layer providing at least a portion of a gate dielectric; and
    forming a gate electrode over the gate dielectric, wherein the gate electrode extends over at least one of the trench isolation active area edges.

14. The method of claim 13, further comprising performing additional oxidization, to convert a portion of the silicon surface covered by the layer of polycrystalline or amorphous silicon to a silicon oxide portion; the silicon oxide portion providing at least a portion of the gate dielectric.

15. The method of claim 14, further comprising forming a pad oxide over the silicon surface.

16. The method of claim 15, wherein forming the pad oxide comprises thermally growing the pad oxide prior to depositing the layer of polycrystalline or amorphous silicon.

17. The method of claim 13, further comprising thermally growing a pad oxide over the silicon surface prior to depositing the layer of polycrystalline or amorphous silicon.

* * * * *